(12) United States Patent
Sai et al.

(10) Patent No.: US 9,647,830 B2
(45) Date of Patent: May 9, 2017

(54) WIRELESS COMMUNICATION APPARATUS, INTEGRATED CIRCUIT AND WIRELESS COMMUNICATION METHOD

(71) Applicant: Kabushiki Kaisha Toshiba, Minato-ku (JP)

(72) Inventors: Akihide Sai, Kawasaki (JP); Hidenori Okuni, Yokohama (JP); Masanori Furuta, Odawara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/189,226

(22) Filed: Jun. 22, 2016

(65) Prior Publication Data

US 2016/0380758 A1    Dec. 29, 2016

(30) Foreign Application Priority Data

Jun. 25, 2015 (JP) ................................. 2015-127962

(51) Int. Cl.
| | | |
|---|---|---|
| *H04L 7/033* | (2006.01) | |
| *H04L 7/00* | (2006.01) | |
| *H03L 7/14* | (2006.01) | |

(52) U.S. Cl.
CPC ............ *H04L 7/0332* (2013.01); *H03L 7/143* (2013.01); *H04L 7/0037* (2013.01); *H04L 7/0331* (2013.01)

(58) Field of Classification Search
CPC . H03L 7/07; H03L 7/087; H03L 7/091; H03L 7/0991; H03L 2207/06; H03L 7/183; H03L 7/143; H03L 7/0814; H04L 7/0332; H04L 7/0037; H04L 7/0331
See application file for complete search history.

(56) References Cited

U.S. PATENT DOCUMENTS

| | | |
|---|---|---|
| 5,883,930 A | 3/1999 | Fukushi |
| 2013/0181756 A1* | 7/2013 | Ballantyne .............. H03L 7/089 327/157 |
| 2016/0173303 A1 | 6/2016 | Sai et al. |

FOREIGN PATENT DOCUMENTS

| | | |
|---|---|---|
| JP | 2877198 B2 | 1/1999 |
| WO | WO 2015/025965 A1 | 2/2015 |

* cited by examiner

*Primary Examiner* — Vineeta Panwalkar
(74) *Attorney, Agent, or Firm* — Oblon, McClelland, Maier & Neustadt, L.L.P.

(57) ABSTRACT

A wireless communication apparatus has an analog control loop circuitry to generate an analog control signal which adjusts a phase of a voltage-controlled oscillation signal, an integrator to integrate the analog control signal, a phase adjuster to adjust a phase of the voltage-controlled oscillation signal, a digital control loop circuitry, in a first mode, to match a frequency of the voltage-controlled oscillation signal to a frequency of the received signal based on an output signal of the phase adjuster, and in a second mode, to generate a digital control signal which is opposite in phase to the analog control signal and has a frequency, a voltage-controlled oscillator to generate the voltage-controlled oscillation signal based on the analog and digital control signals, and a signal switch to supply the analog control signal to the integrator in the first mode and to the voltage-controlled oscillator in the second mode.

10 Claims, 7 Drawing Sheets

WIRELESS COMMUNICATION APPARATUS, INTEGRATED CIRCUIT AND WIRELESS COMMUNICATION METHOD

CROSS REFERENCE CROSS-REFERENCE TO RELATED APPLICATIONS

This application is based upon and claims the benefit of priority from the prior Japanese Patent Application No. 2015-127962, filed on Jun. 25, 2015, the entire contents of which are incorporated herein by reference.

FIELD

Embodiments of the present invention relate to a wireless communication apparatus, an integrated circuit, and a wireless communication method.

BACKGROUND

A receiver having a digital PLL circuitry has been proposed. In the receiver, after A/D conversion of a received RF signal including FSK data with frequency conversion, the digital PLL circuitry detects phase and frequency offset amounts between a transmitter and a receiver by an angle arithmetic circuitry, and based on the detected offset amounts, the digital PLL circuitry automatically corrects the phase and frequency offsets.

This type of conventional receiver detects the phase and frequency offset amounts using both of in-phase signal and a quadrature signal, and thus has a large circuit scale. The digital PLL circuitry including the angle arithmetic circuitry and the like also has a large circuit scale. It is therefore difficult to reduce power consumption.

DETAILED DESCRIPTION

According to the present embodiment, there is provided a wireless communication apparatus including:

an analog control loop circuitry to generate an analog control signal which adjusts a phase of a voltage-controlled oscillation signal in accordance with a phase of a received signal;

an integrator to integrate the analog control signal;

a phase adjuster to adjust a phase of the voltage-controlled oscillation signal based on an output signal of the integrator;

a digital control loop circuitry, in a first mode, to match a frequency of the voltage-controlled oscillation signal to a frequency of the received signal based on an output signal of the phase adjuster, and in a second mode, to generate a digital control signal which is opposite in phase to the analog control signal and has a frequency in accordance with a frequency of a reference signal and a specific frequency control code;

a voltage-controlled oscillator to generate the voltage-controlled oscillation signal based on the analog and digital control signals; and a signal switch to supply the analog control signal to the integrator in the first mode and to the voltage-controlled oscillator in the second mode.

Hereinafter, embodiments of the present invention will be explained with reference to the drawings. The following embodiments will be explained mainly with unique configurations and operations of a receiver provided in a wireless communication apparatus. However, the receiver may have other configurations and operations which will not be described below. These omitted configurations and operations are also included in the scope of the embodiments. Wireless communication apparatuses according to the following embodiments may include a receiver only or may include other components such as a transmitter. Moreover, the wireless communication apparatuses may be a stand-alone communication apparatus or a portable wireless communication terminal.

First Embodiment

Figure 1:
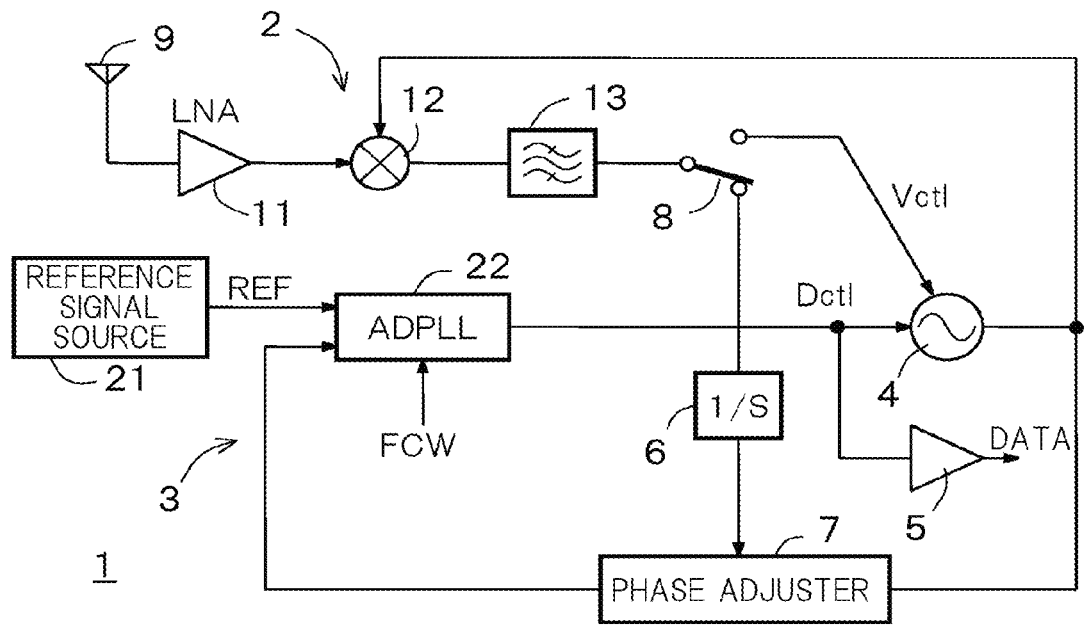
FIG. 1 is a block diagram schematically showing a configuration of a receiver in a wireless communication apparatus according to a first embodiment.

FIG. 1 is a block diagram schematically showing a configuration of a receiver 1 in a wireless communication apparatus according to a first embodiment. The receiver 1 of FIG. 1 is provided with an analog control loop circuitry 2, a digital control loop circuitry 3, a voltage-controlled oscillator 4, a data slicer 5, an integrator 6, a phase adjuster 7, and a demultiplexer (signal switching unit) 8. The receiver 1 of FIG. 1 is used for receiving a PSK signal, for example.

The analog control loop circuitry 2 generates an analog control signal $V_{ctl}$ for adjusting a phase of a voltage-controlled oscillation signal in accordance with the phase of a received signal received by an antenna 9.

The digital control loop circuitry 3 adjusts, in a first mode, the frequency of the voltage-controlled oscillation signal to be equal to the frequency of the received signal based on the output signal (a phase adjusting signal) of the phase adjuster 7. In a second mode, the digital control loop circuitry 3 generates a digital control signal $D_{ctl}$ which is opposite in phase to the analog control signal $V_{ctl}$ and has a frequency in accordance with the frequency of a reference signal and a specific frequency control code. The first and second modes will be described later.

The analog control loop circuitry 2 performs a tracking control so that the frequency of the voltage-controlled oscillation signal tracks the frequency of the received signal. On the contrary, the digital control loop circuitry 3 stops the above tracking control and performs a tracking control so that the frequency of the voltage-controlled oscillation signal tracks a set frequency determined by the reference signal and the frequency control code. As a result of the conflicting tracking controls, the analog control signal $V_{ctl}$ generated by the analog control loop circuitry 2 and the digital control signal $D_{ctl}$ generated by the digital control loop circuitry 3 become differential signals having opposite phases.

The voltage-controlled oscillator 4 (VCO) generates a voltage-controlled oscillation signal (a VCO signal, hereinafter) based on the analog control signal $V_{ctl}$ and the digital control signal $D_{ctl}$.

The data slicer 5 compares the digital control signal $D_{ctl}$ with a specific threshold value, in synchronism with a reference signal REF from a reference signal source 21, to generate a digital signal in accordance with the received signal. The digital signal is a signal obtained by digitally demodulating the received signal. Accordingly, by providing the data slicer 5, there is no need to provide another digital demodulator. The data slicer 5 is a simple circuitry only for comparing the digital control signal $D_{ctl}$ with the threshold value. Therefore, the data slicer 5 can be configured with a simpler internal configuration than with another digital demodulator provided additionally.

The analog control loop circuitry 2 has a low noise amplifier 11, a frequency converter 12, and a low-pass filter 13. The low noise amplifier 11 amplifies the received signal of the antenna 9. The frequency converter 12 generates a phase difference signal between the received signal and the VCO signal. The low-pass filter 13 removes unnecessary high-frequency components contained in the output signal of the frequency converter 12 to generate the analog control signal $V_{ctl}$.

The digital control loop circuitry 3 has a reference signal source 21 and an ADPLL (All Digital Phase Locked Loop) 22. The reference signal source 21 generates a reference signal REF having a frequency $F_{ref}$. The ADPLL 22 performs feed-back control to adjust a set frequency $F_{VCO}$ of the digital control loop circuitry 3 according to the following expression (1). FCW in the expression (1) is a frequency control code input to the ADPLL 22.

$$F_{VCO} = FCW \times F_{ref} \qquad (1)$$

The receiver 1 of FIG. 1 performs channel selection by tuning the set frequency $F_{VCO}$ expressed by the expression (1) to a carrier frequency of the received signal. However, when the received signal has been modulated by, for example, BPSK modulation, the received signal has a phase shift of $\pm\pi/2$. Therefore, there is an inconsistency between a control operation of the analog control loop circuitry 2 to track the received signal phase and a control operation of the digital control loop circuitry 3 to maintain a constant phase. For this reason, in the receiver 1 of FIG. 1, a loop gain of the receiver 1 is set to be much higher than a loop gain of the digital control loop circuitry 3. With this setting, the receiver 1 of FIG. 1 can demodulate and digitally convert a BPSK-modulated signal, thereby improving tolerance against interfering waves superimposed on the modulated signal.

The BPSK-modulated received signal (BPSK signal) and the VCO signal are input to the frequency converter 12. When the VCO signal is delayed by $\pi/2$ in phase to the received signal, the analog control loop circuitry 2 drives the analog control signal $V_{ctl}$ to be shifted to a positive side. When the VCO signal advances by $\pi/2$ in phase to the received signal, the analog control loop circuitry 2 drives the analog control signal $V_{ctl}$ to be shifted to a negative side. In this way, the analog control loop circuitry 2 performs a tracking control of the VCO signal to the phase of the received signal Data.

The digital control loop circuitry 3 operates to obstruct the operation of the analog control loop circuitry 2 described above. Since the digital control loop circuitry 3 has a higher gain than the analog control loop circuitry 2, the digital control signal $D_{ctl}$ is opposite in phase to the analog control signal $V_{ctl}$. As a result, the analog control signal $V_{ctl}$ and the digital control signal $D_{ctl}$ are become differential signals of opposite phases. Accordingly, the BPSK signal can be demodulated by determining the digital control signal $D_{ctl}$ to be 1 ($+\pi/2$) and 0 ($-\pi/2$) when the signal $D_{ctl}$ is driven to be shifted to the positive and negative sides, respectively.

The digital control signal $D_{ctl}$ is input to the voltage-controlled oscillator 4 and the data slicer 5. The data slicer 5 is a digital comparator operating with a reference clock in synchronism with a symbol rate of the received signal. By setting a threshold value to an appropriate level, the data slicer 5 can correctly determine the digital control signal $D_{ctl}$ to be 1 ($+\pi/2$) or 0 ($-\pi/2$).

The demultiplxer 8 supplies the analog control signal $V_{ctl}$ to the integrator 6 in the first mode, and to the voltage-controlled oscillator 4 in the second mode.

The integrator 6 integrates the analog control signal $V_{ctl}$ supplied via the demultiplexer 8. Based on the output signal of the integrator 6, the phase adjuster 7 adjusts the VCO signal phase. The output signal of the phase adjuster 7 is supplied to the ADPLL 22.

The operation principle of the receiver 1 according to the present embodiment will be explained. The received signal received by the receiver 1 has a plurality of packets. Each packet has a preamble signal and target data. The preamble signal is included in the head part of each packet. Therefore, the receiver 1 firstly receives the preamble signal and then the target data, for each packet. Since no effective data are included during the preamble signal reception period, the receiver 1 is not required to perform data demodulation. The receiver 1 according to the present embodiment has a mode of tuning the VCO signal frequency to the received signal frequency using the preamble signal while receiving the preamble signal. In the present embodiment, this mode is referred to as the first mode or an AFC (Automatic Frequency Control) mode. Moreover, in the present embodiment, a mode of receiving and demodulating the target data is referred to as the second mode or a demodulation mode.

In the first mode, the demultiplxer 8 supplies the analog control signal $V_{ctl}$ output from the low-pass filter 13, not to the VCO 4, but to the integrator 6. The integrator 6 integrates the analog control signal $V_{ctl}$. Based on the integrated signal, the phase adjuster 7 adjusts the VCO signal phase.

In the first mode, since there is no need to perform a data demodulation process, there is no practical problem in lowering the cut-off frequency of the low-pass filter 13 than that of the second mode. Therefore, even if there is a high-power interfering wave near a reception bandwidth, by adjusting the cut-off frequency of the low-pass filter 13, the interfering wave can be suppressed to an ineffective level.

Figure 2:
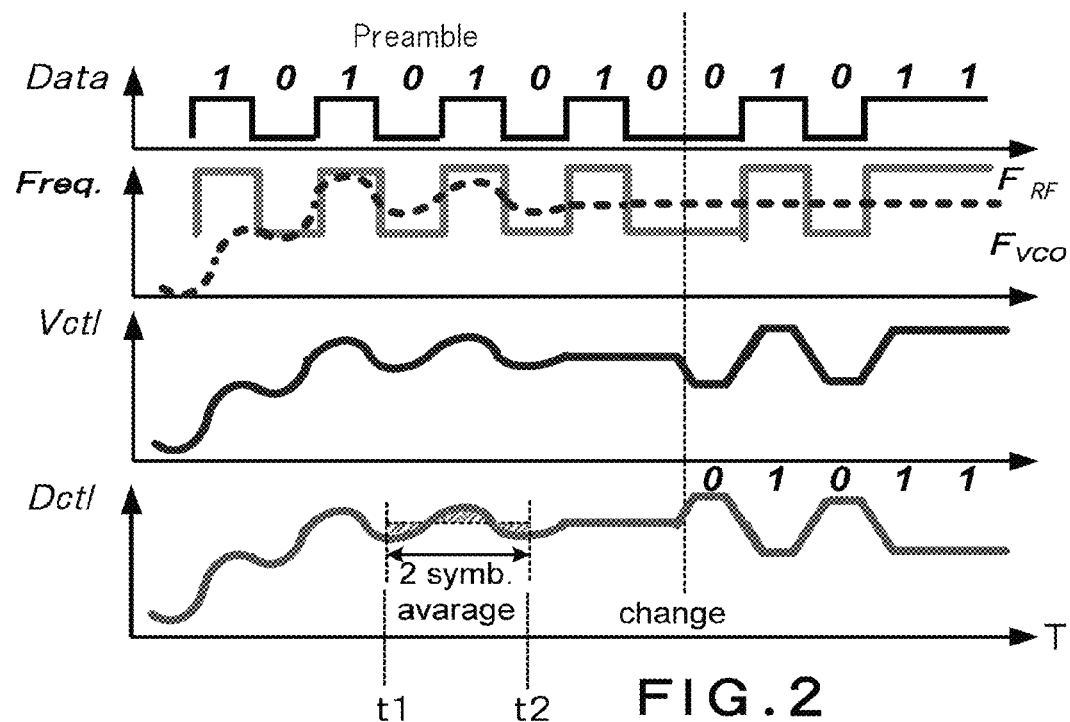
FIG. 2 is a signal waveform diagram in a first mode.

FIG. 2 is a signal waveform diagram in the first mode. FIG. 2 shows an example with a symbol string 10101010 having eight preamble signals included in a received signal. When a received signal includes a symbol string of preamble signals, the demultiplxer 8 supplies an analog control signal output from the low-pass filter 13 to the integrator 6. In the first mode, the digital control loop circuitry 3 performs PLL control to control the VCO signal frequency in accordance with a received signal frequency. By the PLL control, during a preamble period, a VCO signal frequency $F_{vco}$ tracks the received signal frequency and, as a result, a frequency difference between the VCO signal frequency $F_{vco}$ and a reference signal frequency FRF becomes the value of a frequency control code FCW. Therefore, when the first mode is switched to the second mode, the VCO signal frequency $F_{vco}$ matches the reference signal frequency FRF. As described, the demultiplxer 8 performs mode switching for each of a plurality of packets such that the mode is switched to the first mode in accordance with the reception timing of a preamble signal of each packet and to the second mode in accordance with the reception timing of target data.

Figure 3:
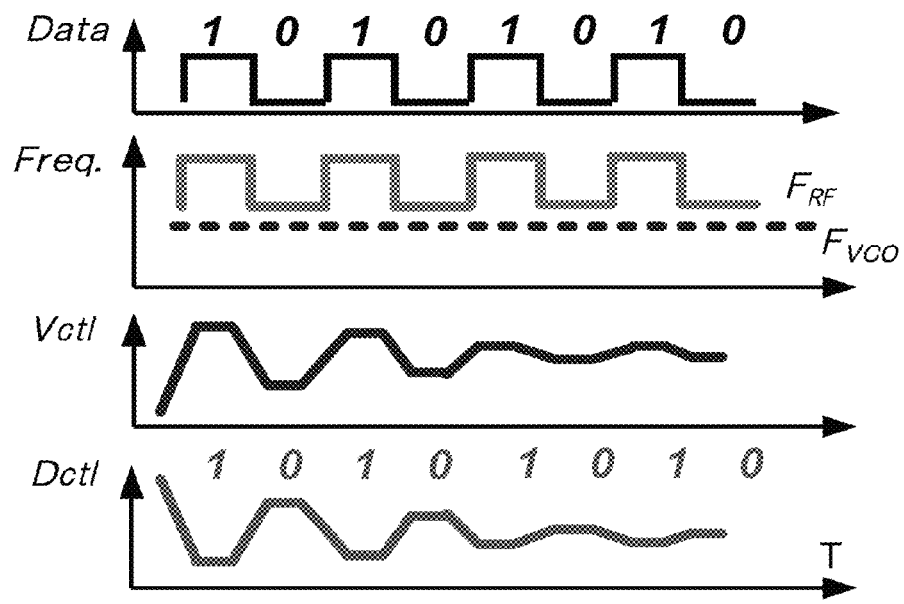
FIG. 3 is a signal waveform diagram without the first mode.

FIG. 3 is a signal waveform diagram without the first mode. In this case, the frequency difference between the VCO signal frequency $F_{vco}$ and the reference signal frequency FRF becomes largely different from the value of the frequency control code FCW. It is therefore difficult to match the VCO signal frequency $F_{vco}$ to the reference signal frequency FRF.

Figure 4:
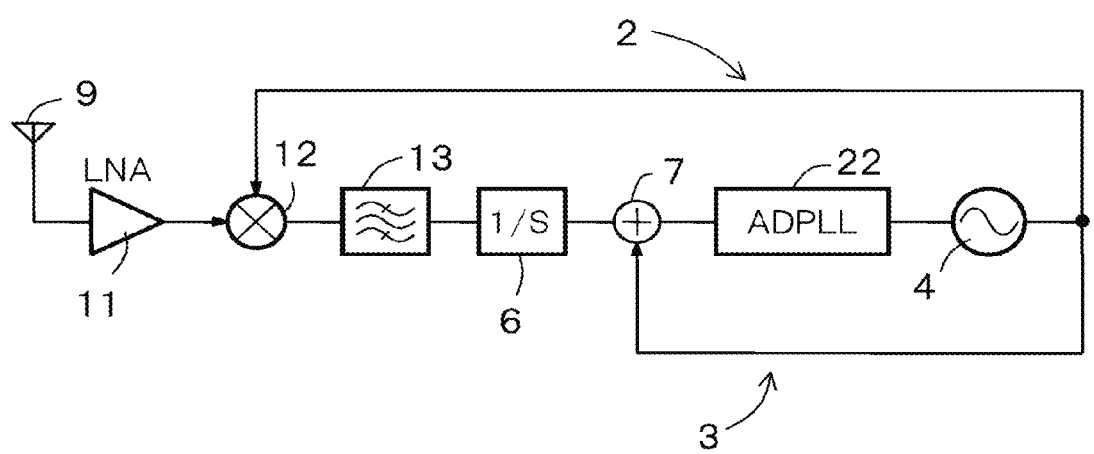
FIG. 4 is an equivalent block diagram of a receiver in the first mode.

FIG. 4 is an equivalent block diagram of the receiver 1 in the first the mode. As shown in FIG. 4, in the first mode, the digital control loop circuitry 3 performs PLL control in the analog control loop circuitry 2. In a more specific manner, the analog control loop circuitry 2 feeds back the VCO signal to the frequency converter 12 to match the VCO signal frequency to the received signal frequency. By contrast, the digital control loop circuitry 3 feeds back the VCO signal to the ADPLL 22 via the phase adjuster 7 to match the VCO signal frequency to the received signal frequency.

As described above and as shown in the signal waveform diagram of FIG. 2, before the completion of preamble signal reception, the VCO signal frequency can be matched to the received signal frequency.

In the first mode, since the digital control loop matches the VCO signal frequency to the received signal frequency, a digital control signal for the VCO signal frequency to be matched to the received signal frequency can be stored as a digital value in a register or the like (not shown). Therefore, in the succeeding reception of target data in the received signal, by using the stored digital value, the frequency difference between the received signal frequency and the reference frequency of the receiver 1 can be accurately detected. Accordingly, even if there is a frequency error between a transmitter and the receiver 1, a demodulation process can be normally performed. As described, according to the present embodiment, a phase and frequency offset correction process between the transmitter and the receiver 1 can be performed with a simple configuration.

During the preamble signal reception, as shown by t1 to t2 in FIG. 2, by taking the average of a digital control signal Dctl for two symbols of a preamble signal, more accurate phase and frequency correction amounts can be detected.

As described above, in the first embodiment, the demultiplxer 8, the integrator 6, and the phase adjuster 7 are provided within the receiver 1 having the analog control loop circuitry 2 and the digital control loop circuitry 3. The digital control loop circuitry 3 performs PLL control to match the VCO signal frequency to the received signal frequency during preamble signal reception based on the analog control signal $V_{ct}$. By the PLL control, before a demodulation process with the received signal, the VCO signal frequency can be locked to the received signal frequency. Therefore, a phase and frequency offset correction process between a transmitter and the receiver 1 can be performed simply and accurately.

Especially, in the present embodiment, the analog control loop circuitry 2 and the digital control loop circuitry 3 are used to perform a frequency offset correction process between a transmitter and the receiver 1. Therefore, a digital circuity for the exclusive use in the frequency offset correction process can be scaled down with smaller power consumption.

Moreover, according to the present embodiment, by raising the loop gain of the digital control loop circuitry 3 higher than the loop gain of the analog control loop circuitry 2, even if there is a high-power interfering wave, the voltage-controlled oscillator 4 can be protected from being pulled to the interfering wave frequency.

The loop gain of the digital control loop circuitry 3 is higher at a lower frequency side and lower at a higher frequency side. Therefore, unnecessary interfering wave components can be suppressed by the gain difference between the lower and higher frequency sides.

Furthermore, according to the present embodiment, the data slicer 5 generates a digitally-modulated digital signal, with no separated digital demodulator required, and hence the receiver 1 can be configured with a simple internal configuration.

Second Embodiment

In a second embodiment, the phase adjuster 7 has a detailed circuitry.

Figure 5:
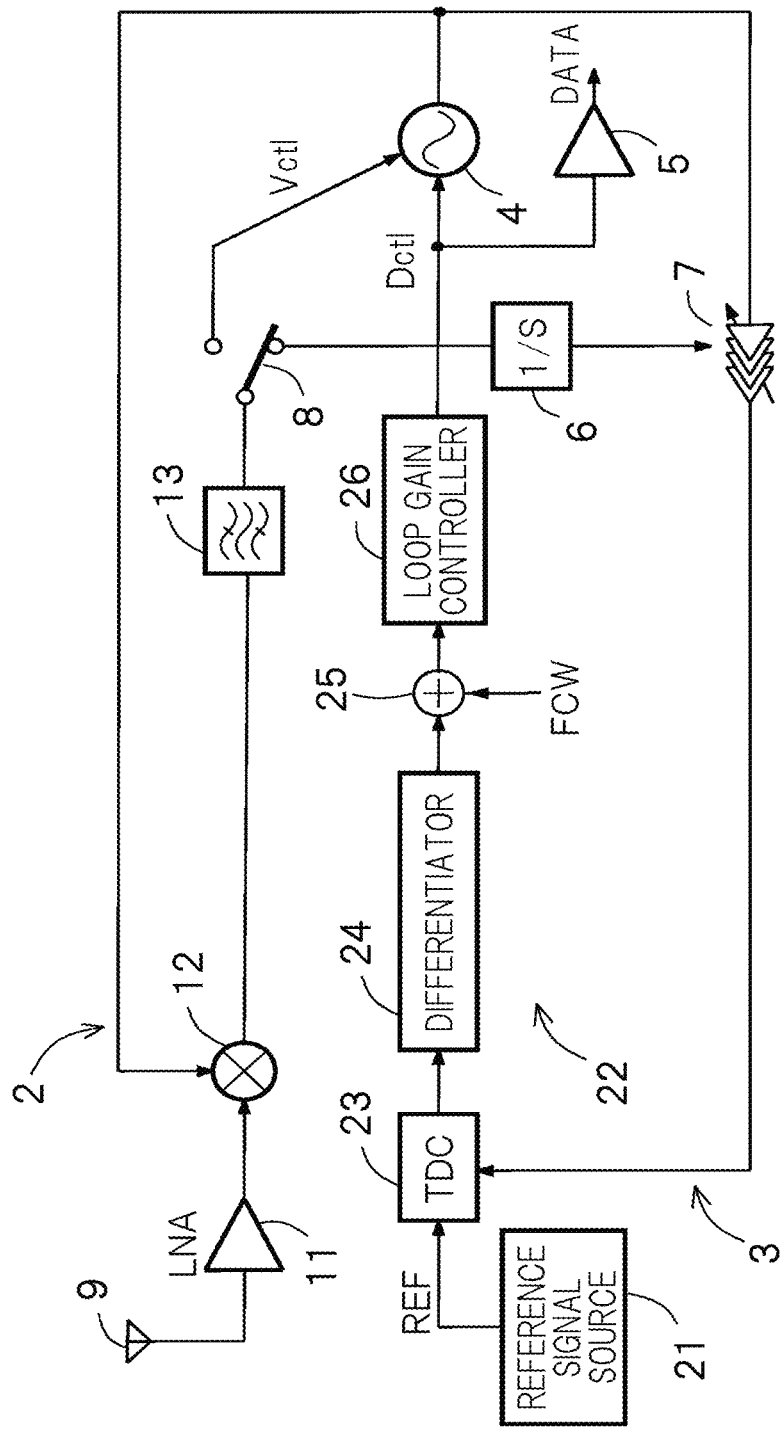
FIG. 5 is a block diagram showing the internal configuration of a receiver according to a second embodiment.

FIG. 5 is a block diagram showing the internal configuration of a receiver 1 according to the second embodiment. Although the receiver 1 of FIG. 5 is different from that of FIG. 1 in that the ADPLL 22 and the phase adjuster 7 have a detailed internal configuration, the remaining circuitries are the same between FIGS. 1 and 5.

The ADPLL 22 of FIG. 5 has a time-to-digital converter (TDC) 23, a differentiator 24, a subtractor 25, and a loop gain controller 26. In synchronism with a reference signal from the reference signal source 21, the TDC 23 detects a VCO signal phase based on the output signal of the phase adjuster 7. The differentiator 24 differentiates the output signal of the TDC 23 to convert a signal that represents the VCO signal phase into a frequency signal. The subtractor 25 detects a difference between the output signal of the differentiator 24 and the frequency control code FCW to generate a frequency error signal. The ADPLL 22 operates, for example, as a type-II ADPLL. The type-II ADPLL has a loop gain that is reduced with a second-order gradient at a higher frequency side. For this reason, the loop gain controller 26 is placed at the output stage of the subtractor 25. The loop gain controller 26 smoothes the frequency error signal by removing a higher frequency component than the received signal of the receiver 1 to generate a digital control signal $D_{ctl}$.

The phase adjuster 7 of FIG. 5 has a plurality of series-connected inverters (delay circuitries). The inverters can variably adjust a delay time based on the output signal of the integrator 6. For the delay time variable adjustments, the number of inverters may be varied or the delay time may be adjusted for each inverter. The output signal phase of the phase adjuster 7 can be adjusted by adjusting the delay times of the inverters.

The internal configuration of the phase adjuster 7 is not limited to that of FIG. 5.

As described above, in the second embodiment, since the phase adjuster 7 has a plurality of delay-time adjustable inverters, the internal configuration of the phase adjuster 7 can be simplified with a lower installation cost. The second embodiment has the same advantageous effects as the first embodiment.

Third Embodiment

A third embodiment has a different TDC internal configuration from that of FIG. 1, in order to omit the phase adjuster.

Figure 6:
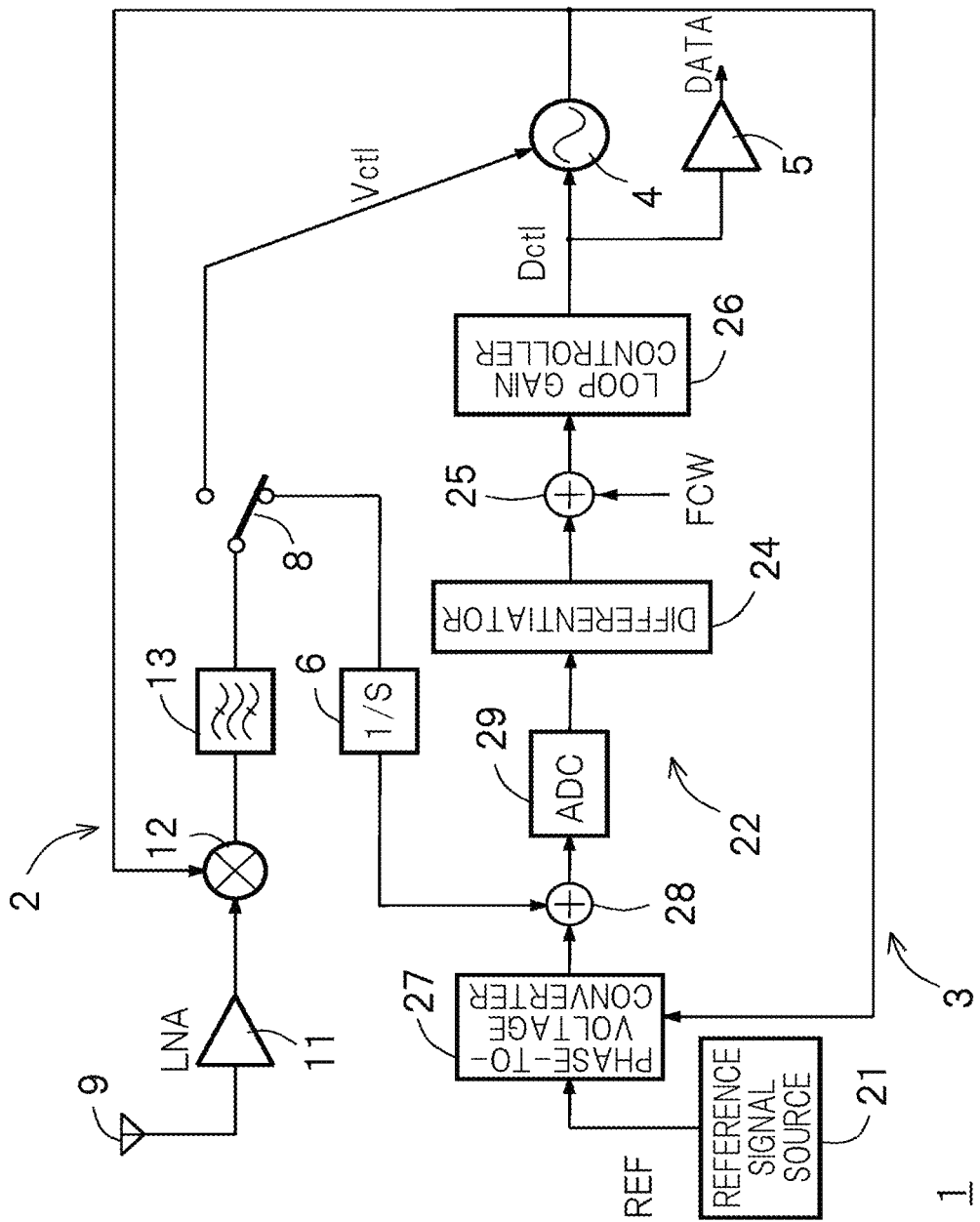
FIG. 6 is a block diagram showing the internal configuration of a receiver according to a third embodiment.

FIG. 6 is a block diagram showing the internal configuration of a receiver 1 according to the third embodiment. The receiver 1 of FIG. 6 has, in place of the TDC 23 of FIG. 1, a phase-to-voltage converter 27, an adder 28, and an A/D converter (ADC) 29, but omits the phase adjuster 7 of FIG. 1. The other configuration is the same as that of the receiver 1 of FIG. 1. The phase-to-voltage converter 27, the adder 28, and the A/D converter 29 of FIG. 6 substantially correspond to the phase adjuster 7 of FIG. 1.

The phase-to-voltage converter 27 generates a phase-to-voltage converted VCO signal. The adder 28 adds the output signal of the phase-to-voltage converter 27 and the output signal of the integrator 6. The A/D converter 29 converts the output signal of the adder 28 into a digital phase difference signal. The digital phase difference signal is differentiated by the differentiator 24 to be converted into a frequency error signal.

As described above, in the third embodiment, the output signals of the integrator 6 and the phase-to-voltage converter 27 are added to each other by the adder 28 to detect phase offset information. Also in the third embodiment, the analog control loop circuitry 2 and the digital control loop circuitry 3 are used to perform a phase and frequency offset correction process between a transmitter and the receiver 1 based on a preamble signal in a received signal. Therefore, an offset correction exclusive-use circuitry can be scaled down.

Fourth Embodiment

The above first to third embodiments have been described with the configuration and operation of the receiver 1. A fourth embodiment will be described with an example of hardware of a wireless communication apparatus provided with a transmitter, in addition to the receiver 1 of any one of the first to third embodiments. Since the wireless communication apparatus of the fourth embodiment has the receiver 1 of any one of the first to third embodiments, the detailed explanation of the receiver 1 is omitted.

Figure 7:
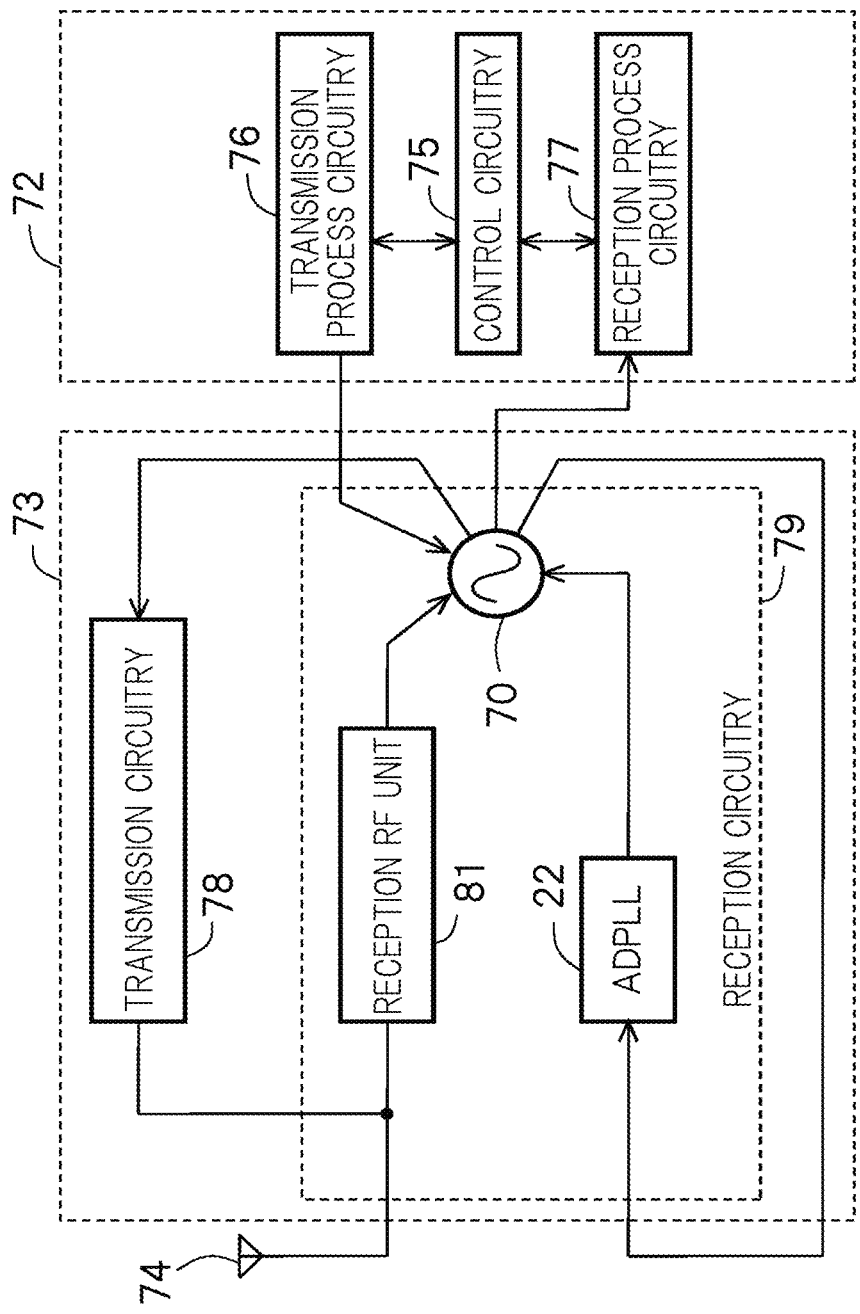
FIG. 7 is a block diagram schematically showing a configuration of a wireless communication apparatus according to a fourth embodiment.

FIG. 7 is a block diagram schematically showing the configuration of a wireless communication apparatus 71 according to the fourth embodiment. The wireless communication apparatus 71 of FIG. 7 is provided with a baseband process unit 72, an RF unit 73, and an antenna 74.

The baseband process unit 72 has a control circuitry 75, a transmission process circuitry 76, and a reception process circuitry 77. Each circuitry in the baseband process unit 72 performs digital signal processing.

The control circuitry 75 performs, for example, a MAC (Media Access Control) layer process. The control circuitry 75 may perform a process of a network layer higher than the MAC layer. The control circuitry 75 may perform a process related to MIMO (Multi-Input Multi-Output). For example, the control circuitry 75 may perform a propagation path estimation process, a transmission weight calculation process, a stream separation process, etc.

The transmission process circuitry 76 generates a digital transmission signal. The reception process circuitry 77 performs, after demodulation, decoding, etc., a preamble and physical header analysis process, and the like.

The RF unit 73 has a transmission circuitry 78 and a reception circuitry 79. The transmission circuitry 78 includes a transmission filter (not shown) for extracting a transmission band signal, a mixer (not shown) for up-converting a signal, after passing through the transmission filter, into a radio frequency by using an oscillation signal of a digital-controlled oscillator (DCO) 70, and a preamplifier (not shown) for amplifying an up-converted signal. The reception circuitry 79 is configured in the same manner as the receiver 1 of any one of the above-described first to third embodiments.

Although the transmission circuitry 78 and the reception circuitry 79 of FIG. 7 share the DCO 70, each circuitry may have its own DCO.

For radio signal transmission and reception via the antenna 74, the RF unit 73 may be provided with a switch for connecting either the transmission circuitry 78 or the reception circuitry 79 to the antenna 74. If there is such a switch, the antenna 74 can be connected to the transmission circuitry 78 in transmission and to the reception circuitry 79 in reception.

Figure 8:
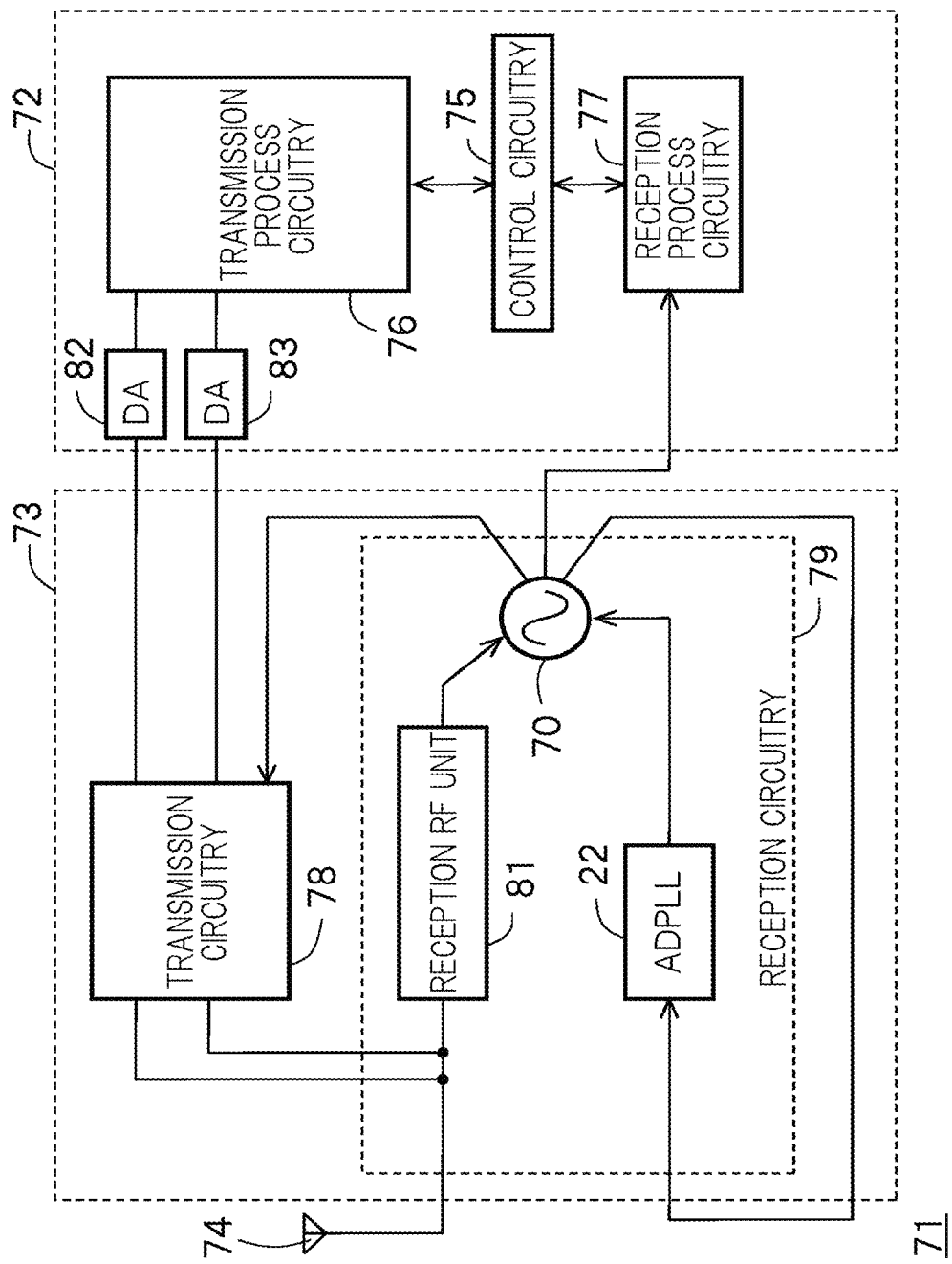
FIG. 8 is a block diagram showing a modification of FIG. 7.

The transmission process circuitry 76 of FIG. 7 outputs one composite transmission signal. However, the transmission signal may be separated into an I-signal and a Q-signal depending on the wireless mode. FIG. 8 shows an example of the wireless communication apparatus 71 in such a case. The wireless communication apparatus 71 of FIG. 8 is different from that of FIG. 7 in configuration from the transmission process circuitry 76 to transmission circuitry 78.

The transmission process circuitry 76 generates two non-composite baseband signals (a digital I-signal and a digital Q-signal, hereinafter).

A DA conversion circuitry 82 for converting the digital I-signal into an analog I-signal and a DA conversion circuitry 83 for converting the digital Q-signal into an analog Q-signal are provided between the transmission process circuitry 76 and the transmission circuitry 78. The transmission circuitry 78 up-converts the analog I- and Q-signals with a mixer (not shown).

The wireless communication apparatuses 71 shown in FIGS. 7 and 8 each can entirely be integrated into one chip IC (Integrated Circuit). Or the wireless communication apparatus 71 of FIG. 7 may be integrated into a plurality of chips. For example, the baseband process unit 72 and the RF unit 73 may be integrated into separate chips. The baseband process unit 72 may be integrated into a plurality of chips. The RF unit 73 may be integrated into a plurality of chips. A part of the RF unit 73 and the baseband process unit 72 may be formed into discrete components, with the remaining integrated into one or a plurality of chips.

The RF unit 73 and the baseband process unit 72 may be configured with a software-reconfigurable software defined radio. In this case, a digital signal processor can be used for performing, with software, the functions of the RF unit 73 and the baseband process unit 72. In this case, buses, a processor unit and an external interface unit are provided inside the wireless communication apparatus 71 shown in FIG. 7 or FIG. 8. The processor unit and the external interface unit are connected via the buses. Firmware runs on the processor unit. The firmware can be updated with a computer program. The firmware runs on the processor unit so that the processor unit performs the operations of the RF unit 73 and the baseband process unit 72 shown in FIG. 7 or FIG. 8.

Although the wireless communication apparatuses 71 shown in FIGS. 7 and 8 have only one antenna 74, there is no particular limitation on the number of antennas. For example, a transmission antenna 74 and a reception antenna 74 may be separately provided. An I-signal antenna 74 and a Q-signal antenna 74 may be separately provided. In the case of one antenna 74, it can be switched by a transmission-reception switch between transmission and reception.

The wireless communication apparatuses 71 of FIGS. 7 and 8 are applicable to a standalone wireless communication apparatus 71 such as an access point, a wireless router and a computer, or a portable wireless communication terminal such as a smartphone and a mobile phone. The wireless communication apparatuses 71 of FIGS. 7 and 8 are also applicable to peripheral equipment such as a mouse and a keyboard for wireless communication with a host device, a card device with a wireless communication function, and a wearable terminal for biological-information wireless communication. As for the wireless mode in which the wireless communication apparatuses 71 of FIG. 7 or 8 have wireless communication each other, a variety of types are applicable with no particular limitation, such as cellular communication in the third generation and thereafter, a wireless LAN, Bluetooth (a registered trademark), and a near-field wireless communication.

Figure 9:
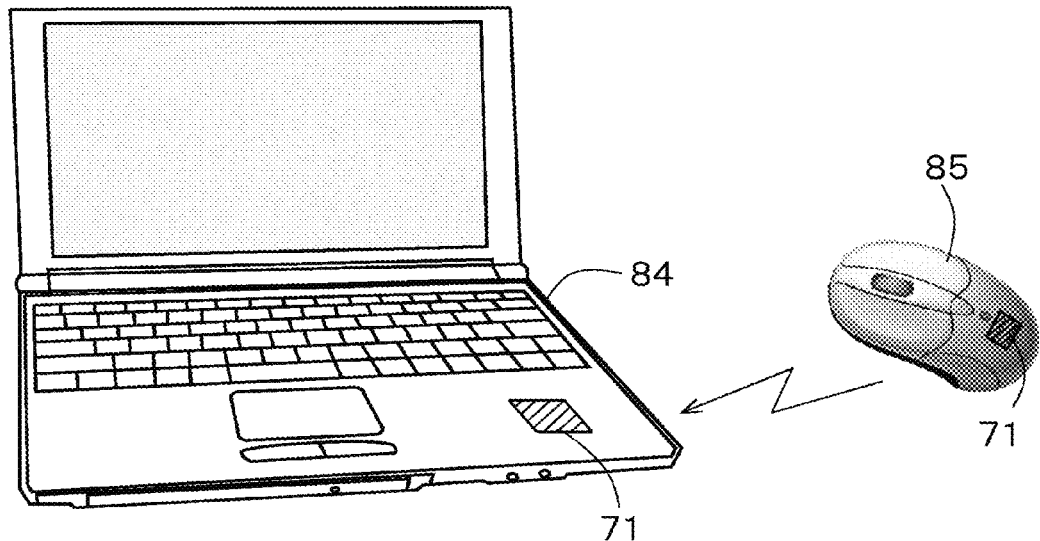
FIG. 9 shows an example of wireless communication between a PC and a mouse.

FIG. 9 shows an example of wireless communication between a PC 84 as a host device and a mouse 85 as peripheral equipment. The PC 84 and the mouse 85 both have the wireless communication apparatus 71 of FIG. 7 or 8 built therein. The mouse 92 performs wireless communication with power of a built-in battery. However, due to the limited space for the built-in battery, the mouse 85 is required to perform wireless communication with power consumption as low as possible. It is therefore preferable to perform wireless communication by a low-power consuming wireless mode such as Bluetooth Low Energy decided in Bluetooth (a registered trademark) 4.0 standard.

Figure 10:
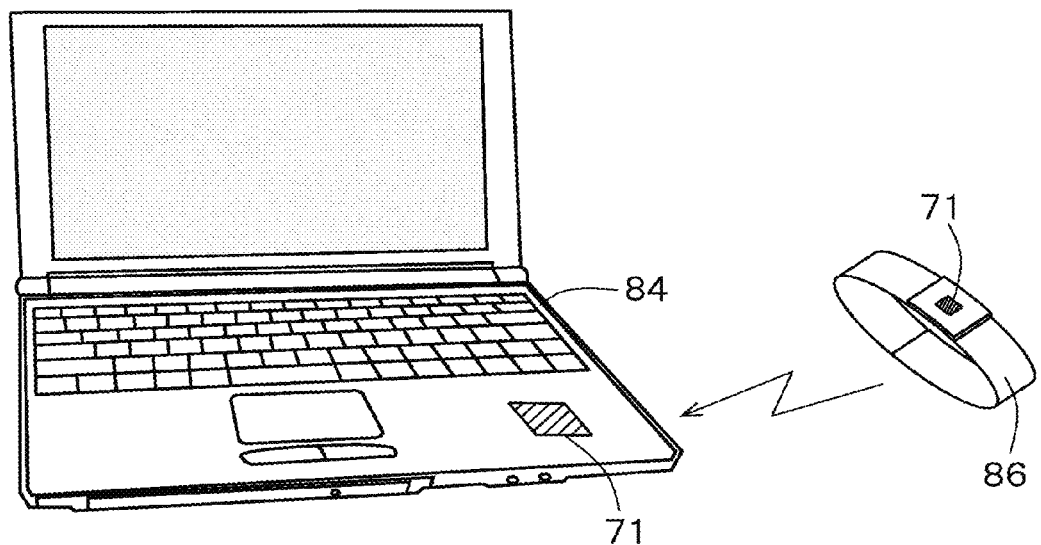
FIG. 10 shows an example of wireless communication between a PC and a wearable terminal.

FIG. 10 shows an example of wireless communication between a wearable terminal 86 and a host device (such as the PC 84). The wearable terminal 86 is attached to a human body, with a variety of types, not only the one attached to an arm as shown in FIG. 10, but also a seal type adhered to a human body, an eyeglass type and an earphone type attached to a human body other than the arm, and a pace maker embedded in a human body. Also in the case of FIG. 10, the wearable terminal 86 and the PC 84 both have the wireless communication apparatus 71 of FIG. 7 or 8 built therein. The PC 84 is a computer, a server, etc. Moreover, the wearable terminal 86 to be attached to a human body has a limited space for a built-in battery, so it is preferable to adopt a low-power consuming wireless mode such as Bluetooth Low Energy described above.

In the case of wireless communication between the wireless communication apparatuses 71 of FIG. 7 or 8, there is no particular limitation on the type of information to be transferred by wireless communication. However, it is preferable to change the wireless mode for the transfer of a large amount of information such as motion video data and for the transfer of a small amount of information such as operation information of the mouse 85. It is required to perform wireless communication in an appropriate wireless mode depending on the amount of information transferred.

Moreover, in the case of wireless communication between the wireless communication apparatuses 71 of FIG. 7 or 8, a notification unit for notifying a user of a wireless communication operational state may be provided. Examples of the notification unit are, for example, an indicator such as an LED for indicating an operational state, a vibrator for notifying an operational state with vibration, and a speaker or a buzzer for notifying an operational state with audio information.

At least part of the receiver 1 and the wireless communication apparatus 71 explained in the above-described embodiments may be configured with hardware or software. When it is configured with software, a program that performs at least part of the functions of the receiver 1 and the wireless communication apparatus 71 may be stored in a storage medium such as a flexible disk and CD-ROM, and then installed in a computer to run thereon. The storage medium may not be limited to a detachable one such as a magnetic disk and an optical disk but may be a standalone type such as a hard disk drive and a memory.

Moreover, a program that achieves the function of at least part of the receiver 1 and the wireless communication apparatus 71 may be distributed via a communication network (including wireless communication) such as the Internet. The program may also be distributed via an online network such as the Internet or a wireless network, or stored in a storage medium and distributed under the condition that the program is encrypted, modulated or compressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A wireless communication apparatus comprising:
an analog control loop circuitry to generate an analog control signal which adjusts a phase of a voltage-controlled oscillation signal in accordance with a phase of a received signal;
an integrator to integrate the analog control signal;
a phase adjuster to adjust a phase of the voltage-controlled oscillation signal based on an output signal of the integrator;
a digital control loop circuitry, in a first mode, to match a frequency of the voltage-controlled oscillation signal to a frequency of the received signal based on an output signal of the phase adjuster, and in a second mode, to generate a digital control signal which is opposite in phase to the analog control signal and has a frequency in accordance with a frequency of a reference signal and a specific frequency control code;
a voltage-controlled oscillator to generate the voltage-controlled oscillation signal based on the analog and digital control signals; and
a signal switch to supply the analog control signal to the integrator in the first mode and to the voltage-controlled oscillator in the second mode.

2. The wireless communication apparatus of claim 1, wherein
the first mode corresponds to a period of receiving a preamble signal contained in the received signal, and
the second mode corresponds to a period of receiving target data contained in the received signal, after the preamble signal.

3. The wireless communication apparatus of claim 2, wherein the received signal includes a plurality of packets, and each packet includes the preamble signal and the target data, wherein,
for each packet, the signal switch is switched to the first mode at a timing of receiving the preamble signal corresponding to each packet and to the second mode at a tuning of receiving the target data.

4. The wireless communication apparatus of claim 1, wherein the phase adjuster comprises a delay circuitry to adjust a delay time based on the output signal of the integrator.

5. The wireless communication apparatus of claim 1, wherein the digital control loop circuitry comprises:
- a time-to-digital converter, in synchronism with the reference signal, to detect a phase of the voltage-controlled oscillation signal based on the output signal of the phase adjuster;
- a differentiator to differentiate the output signal of the time-to-digital converter;
- a subtractor to calculate a difference between an output signal of the differentiator and the specific frequency control code; and
- a loop gain controller to generate the digital control signal based on the difference.

6. The wireless communication apparatus of claim 1, wherein the phase adjuster comprises:
- a phase-to-voltage converter to convert a phase difference between the reference signal and the voltage-controlled oscillation signal into a voltage;
- an adder to add an output signal of the phase-to-voltage converter and the output signal of the integrator; and
- an analog-to digital converter to convert an output signal of the adder into a digital phase difference signal, and
wherein the digital control loop circuitry comprises a loop gain controller to generate the digital control signal based on the digital phase difference signal.

7. The wireless communication apparatus of claim further comprising an integrated circuit that comprises the analog control loop circuitry, the digital control loop circuitry, the voltage-controlled oscillator, and the signal switch.

8. The wireless communication apparatus of claim 1 further comprising at least one antenna.

9. A wireless communication apparatus comprising an RF unit and a baseband unit, wherein
the RF unit comprises a transmission circuitry and a reception circuitry; and
the baseband unit comprises a transmission process circuitry and a reception process circuitry, wherein
the reception circuitry comprises:
- an analog control loop circuitry to generate an analog control signal which adjusts a phase of a voltage-controlled oscillation signal in accordance with a phase of a received signal;
- an integrator to integrate the analog control signal;
- a phase adjuster to adjust a phase of the voltage-controlled oscillation signal based on an output signal of the integrator;
- a digital control loop circuitry, in a first mode, to match a frequency of the voltage-controlled oscillation signal to a frequency of the received signal based on an output signal of the phase adjuster, and in a second mode, to generate a digital control signal which is opposite in phase to the analog control signal and has a frequency in accordance with a frequency of a reference signal and a specific frequency control code;
- a voltage-controlled oscillator to generate the voltage-controlled oscillation signal based on the analog and digital control signals; and
- a signal switch to supply the analog control signal to the integrator in the first mode and to the voltage-controlled oscillator in the second mode.

10. A wireless communication method comprising
using an analog control loop circuitry to generate an analog control signal which adjusts a phase of a voltage-controlled oscillation signal in accordance with a phase of a received signal;
integrating the analog control signal;
adjusting a phase of the voltage-controlled oscillation signal based on the analog control signal thus integrated to generate a phase-adjusted signal;
using a digital control loop circuitry, in a first mode, to match a frequency of the voltage-controlled oscillation signal to a frequency of the received signal based on the phase-adjusted signal, and in a second mode, to generate a digital control signal which is opposite in phase to the analog control signal and has a frequency in accordance with a frequency of a reference signal and a specific frequency control code;
generating the voltage-controlled oscillation signal based on the analog and digital control signals; and
integrating the analog control signal in the first anode and generating the voltage controlled oscillation signal based on the analog control signal in the second mode.

* * * * *